United States Patent [19]
Grabbe

[11] Patent Number: 4,747,483
[45] Date of Patent: May 31, 1988

[54] PROTECTIVE CHIP CARRIER HANDLER

[75] Inventor: Dimitry G. Grabbe, Middletown, Pa.

[73] Assignee: AMP Incorporated, Harrisburg, Pa.

[21] Appl. No.: 916,583

[22] Filed: Oct. 8, 1986

[51] Int. Cl.[4] .............................................. B65D 73/02
[52] U.S. Cl. .................................. 206/329; 206/331; 206/332; 206/334
[58] Field of Search ............... 206/328, 329, 331, 334, 206/332

[56] References Cited

U.S. PATENT DOCUMENTS

| | | | |
|---|---|---|---|
| 4,331,831 | 5/1982 | Ingram et al. | 174/52 P |
| 4,483,441 | 11/1984 | Akizawa et al. | 206/334 X |
| 4,564,880 | 1/1986 | Christ et al. | 361/212 |
| 4,615,491 | 10/1986 | Nakamura | 206/334 X |
| 4,681,221 | 7/1987 | Chickanosky et al. | 206/328 |

Primary Examiner—William I. Price
Attorney, Agent, or Firm—Bruce J. Wolstoncroft

[57] ABSTRACT

A chip carrier handler has an opening located therein for receiving a chip carrier of the type having leads extending from midsections of the sides thereof. The height of the chip carrier handler is essentially equal to the height of the chip carrier. Securing members for securing the chip carrier in the handler opening must be made from extremely thin material and mounted on the chip carrier handler in such a manner as to utilize the resilient nature of the securing members without overstressing the members. The configuration of the chip carrier handler is in a form to allow for manual or robotic manipulation.

20 Claims, 4 Drawing Sheets

PROTECTIVE CHIP CARRIER HANDLER

BACKGROUND OF THE INVENTION

The present invention relates to a chip carrier protective handler and more particularly to a protective handler which allows for simplicity of automation and robotic manipulation of the chip carrier in the protective handler.

The chip carrier in its most common form is a body of plastic or ceramic containing an integrated circuit either singly or in multiples with connecting leads extending on the perimeter of a generally rectangular flat package. As the number of leads required per chip has drastically increased while the body of the package has shrunk due to the electrical requirements, the new high density packages contain densely spaced, fragile, easily deformable leads.

These chip carriers, with fragile leads, must be handled during the process of burning-in, testing and imprinting of the final designating code and serial numbers. Once testing is complete, the chip carriers are finally fed through the machine for placement on the printed circuit board. This handling of the components in the workplace has resulted in damage and distortion of the leads which renders them useless. The distortion of the leads of such devices are easily damaged because they do not possess the sufficient mechanical strength and integrity required to overcome the insertion force required to insure positive electrical contact. The force which is required is of a magnitude which would permanently deform the chip carrier lead.

Since the leads are not capable of sustaining the force of the contacts from burn-in and other sockets, the protective handler must provide the means for aligning, positioning and supporting the leads of the chip carriers and must be able to withstand a large number of burn-in cycles lasting typically 40-80 hours at a temperature approaching 200° C.

In an effort to provide the required protection, various chip carrier handlers have been devised. An example of such a chip carrier socket is disclosed in U.S. Pat. No. 4,564,880.

However, these chip carrier handlers suffer from several major problems. Many of the chip carrier handlers are large and bulky relative to the size of the chip carrier, preventing the chip carrier handler from being useful in circumstances where size must be minimized. Also, most of the chip carrier handlers were not designed with any consideration for use with a robotic handling device or for the positioning of leads during the high temperature "burn-in" cycle. Consequently, many of the chip carrier handlers cannot be adapted for use with robotic handling devices. This causes the price of testing, etc. to be effectively increased as manual labor must be used as compared to the use of cheaper robotic equipment.

Consequently, an optimal goal is to manufacture a chip carrier handler which is capable of properly protecting the integrated circuit while expending the least amount of material to manufacture the socket and the least amount of manual handling of the socket during testing, etc. It is therefore advantageous to provide a chip carrier handler capable of withstanding "burn-in" temperatures of up to 200° C., which protects the integrated circuit from physical damage as well as allowing for robotic handling of the handler.

SUMMARY OF THE INVENTION

The present invention is directed to a chip carrier handler for use with a chip carrier. The chip carrier has leads extending from a midsection of each side thereof.

The chip carrier handler is comprised of housing means having a first and a second major surface. An opening is positioned in the center of the housing and extends through the housing from the first major surface to the second major surface. The opening is dimensioned to receive the chip carrier therein.

Recesses are provided adjacent the opening and extend from the first major surface partially toward the second major surface. The recesses are positioned to receive the leads of the chip carrier.

Slidably mounted to the housing means are securing means which have chip carrier engagement means attached thereto. The chip carrier engagement means is pivotally mounted to the housing means such that the chip carrier engagement means is movable between a first and a second position. The first position is one in which the chip carrier engagement means is positioned above the opening of the chip carrier handler, whereby as the chip carrier is inserted into the opening of the chip carrier handler, the securing means is slidably engaged causing the engagement means to pivot, moving the engagement means away from the opening. This allows the chip carrier to be inserted into the opening under zero insertion force condition. As the chip carrier reaches its fully inserted position, i.e., when upper surfaces of the leads contact a bottom of the recess, the securing means is allowed to resiliently return to the unstressed position. This causes the engagement to return to the first position, thereby maintaining the chip carrier in the opening of chip carrier handler.

It is the object of the invention to provide a chip carrier handler which has the same height as the chip carrier. This is done to minimize cost of production (less material being used) as well as to facilitate the liquid printing operation.

It is a further object of this invention to provide a chip carrier handler which is suited both for manual as well as robotic manipulation.

BRIEF DESCRIPTION OF THE DRAWINGS

FIG. 4 is a fragmentary cross sectional view showing the chip carrier fully inserted in the opening of the chip carrier handler, the lead being in engagement with a contact of an interposer socket.

DETAILED DESCRIPTION OF THE INVENTION

Figure 1:
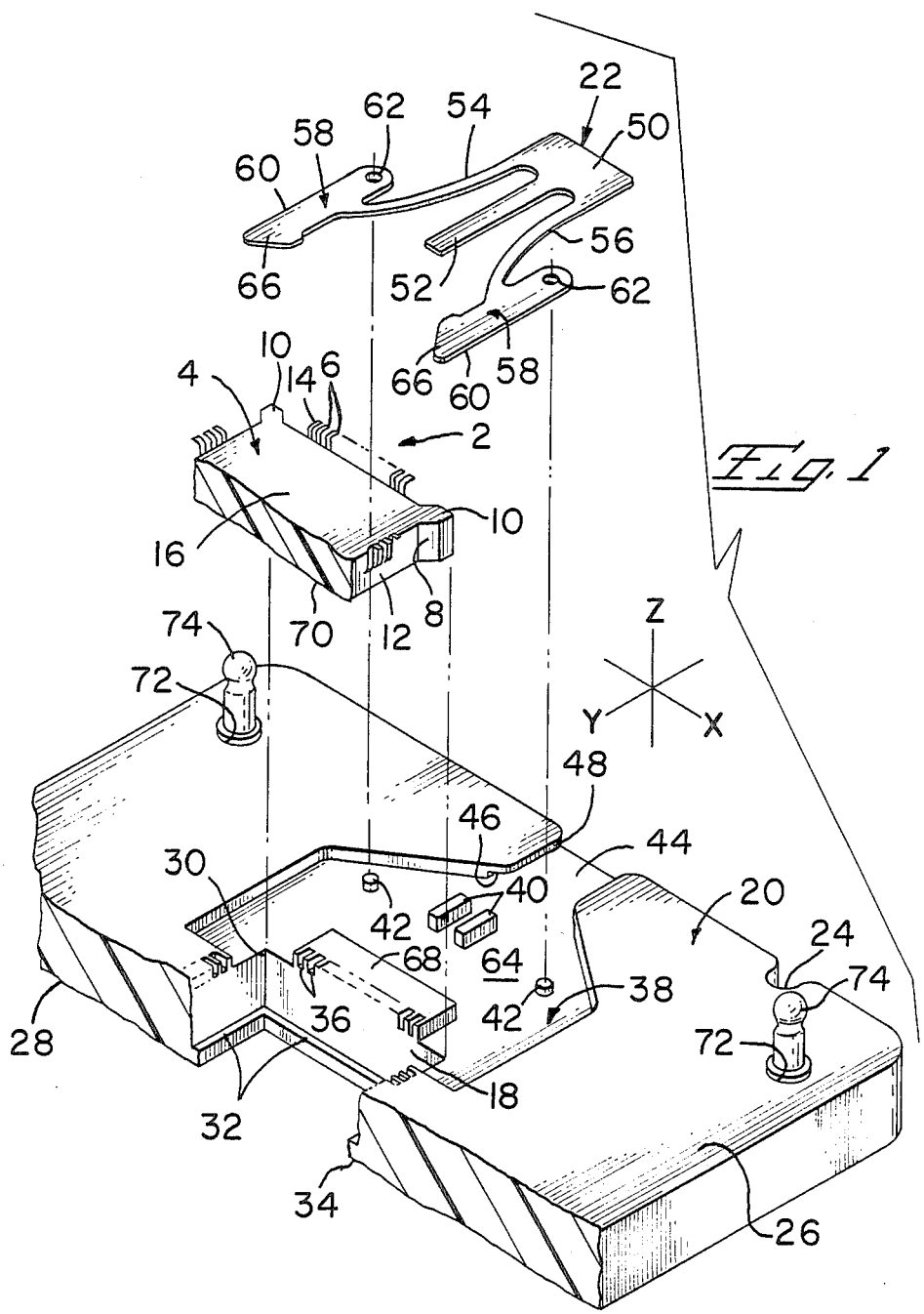
FIG. 1 is a perspective fragmentary view of the chip carrier handler showing the securing member and a portion of the chip carrier exploded therefrom.

A chip carrier 2 of the type described in U.S. Pat. No. 4,331,831 is hereby incorporated by reference. Chip carrier 2 is of the type having a rectangular body 4 with leads 6 extending therefrom. Leads 6 are positioned in recesses 8 which are formed between respective opposing corner projections 10 of chip carrier 1. As can be seen from FIG. 2, leads 6 extend through a midsection of each wall 12 of chip carrier 2 and are bent such that ends 14 of leads 6 extend beyond a bottom surface 16 of body 4.

Chip carrier 2 is positioned in an opening 18 of chip carrier handler 20. Securing member 22 of chip carrier handler 20 maintains chip carrier 2 in opening 18 as transportation and testing of chip carrier 2 are performed, as will be discussed.

Chip carrier handler 20 as recesses 24 positioned on the outside perimeter thereof. These recesses 24 are provided to allow fingers of a robotic handler (not shown) to engage chip carrier handler 20, enabling chip carrier handler 20 to be moved to an appropriate location by the robotic handler, i.e., the test site. The positioning of recesses 24 must be such that recesses 24 do not adversely affect the other operations of chip carrier handler 20, in particular the positioning of recesses 24 must not interfere with the operation of securing member 22.

Opening 18 in chip carrier handler 20 extends from a first major surface 26 of chip carrier handler 20 to a second major surface 28 thereof. Opening 18 is dimensioned to receive chip carrier 2, suc that as chip carrier 2 is inserted into opening 18 of chip carrier handler 20, corner projections 10 of chip carrier 2 cooperate with corners 30 of opening 18 of chip carrier handler 20. The dimensions of corner projections 10 and corners 30 are substantially identical, and therefore, the interaction of corner projections 10 with corners 30 maintains chip carrier 2 in proper angular alignment, preventing rotational movement of the chip carrier 2 relative to handler 20.

The shape of opening 18 is such that chip carrier 2 must be inserted into handler 20 through first major surface 26. A ledge 32, having a top surface 34 coplanar with second major surface 28 of chip carrier handler 20, is positioned across a portion of opening 18. Ledge 32 is provided such that as chip carrier 2 is inserted through first major surface 26, leads 6 of chip carrier 2 cooperate with ledge 32 to prevent chip carrier 2 from being inserted too far into opening 18 of chip carrier handler 20. Ledge 32 is made in such a way that as chip carrier 2 is being inserted into opening 18, ledge 32 will be engaged by leads 6 at a point where the sections of leads 6, that extend outwardly from the respective walls 12 of chip carrier 2, are at their strongest. This is at the point where leads 6 extend outward normal from the midsection of wall 12 of chip carrier 2, giving leads 6 the support required to maintain chip carrier 2 in place, thereby preventing chip carrier 2 from falling through second major surface 28. Each individual lead 6 is also supported by a respective recess 36, preventing leads from deforming in a direction perpendicular to the plane of leads 6, as well as in a direction corresponding to the plane of leads 6.

Chip carrier handler 20 is provided with securing member receiving recesses 38 which are located in a first major surface 26 of chip carrier handler 20 as viewed in FIG. 1. Recesses 38 are mirror images of each other, with each recess 38 extending from the edge of chip carrier handler 20 to opening 18 on opposing sides thereof. In comparison to opening 18, recesses 38 are much shallower. However, recesses 38 must be wider than opening 18 to allow securing member 22 to operate as required, as will be discussed.

Rectangular projections 40 and circular projections 42 are positioned in recesses 38 to maintain securing members 22 in position as will be discussed later. The shape of each recess 38 is such that as each recess 38 nears the edge of chip carrier handler 20, recess 38 narrows to form a narrow section 44. Narrow sections 44 have side walls 46 which have lip sections 48. Lip sections 48 project into narrow sections 44 to maintain securing member 22 in place, as will be discussed.

Securing member 22 is stamped or otherwise produced from metal having the desired characteristic properties. Securing member 22 is comprised of a body portion 50 having three legs 52, 54, 56. Middle leg 52 is rectangular and extends away from body 50 in the same plane as body 50. Outer legs 54, 56 are positioned on each side of middle leg 52 and also extend from body 50 in the same plane as body 50. Outer legs 54, 56 are longer and thinner than middle leg 52. Each outer leg 54, 56 has an arcuate configuration while middle leg 52 extends essentially perpendicular from an inner edge of body 50.

Chip carrier engagement members 58 are attached about midway thereof to each outer leg 54, 56 at the end of legs 54, 56 opposite body 50. Outside surfaces 60 of members 58 are essentially parallel to each other when members 58 are in an unstressed position. An opening 62 is provided on each member 58 to cooperate with circular projections 42 located in recess 38 of chip carrier handler 20. As members 58 cooperate with projections 42, middle arm 52 cooperates with rectangular projections 40. The combination of the various projections cooperating with the various parts of securing members 22 ensures that securing members 22 will be properly mounted on chip carrier handler 20, such that securing members 22 will be slidably movable in recesses 38.

Securing members 22 must be installed in recesses 38 of chip carrier handler 20 before normal operation is begun. During installation, the outside edges of securing members 22 are brought into contact with recesses 38 and are then slid toward the edge of chip carrier handler 20, with body portions 50 of securing members 22 being slid underneath lips 48 of narrow sections 44, thereby preventing body portions 50 from moving away from surfaces 64 of recesses 38. Securing members 22 are slid toward the outside edge of chip carrier handler 20 until openings 62 of members 58 are aligned with projections 42 of recesses 38. As projections 42 align with openings 62, middle legs 52 are disposed between projections 40 such that securing members 22 may be pushed downward, forcing bottom surfaces of securing members 22 to engage surfaces 64 of recesses 38. Therefore, before securing members 22 are permanently attached to chip carrier handler 20, both portions 50 must be slid underneath lips 48, projections 42 must be positioned in openings 62, and middle legs 52 must be positioned between rectangular projections 40.

With securing members 22 received properly in recesses 38, heat staking may be performed. A hot iron is brought into engagement with projections 40, 42 of recesses 38. As the hot iron touches the plastic projections, the plastic is melted, causing the plastic to flow, widening the top of projections 40, 42. This widening of projections 40 is performed in a controlled manner to insure that the widening is enough to prevent legs 52 from moving in the X and Z directions while still permitting legs 52 to move in the Y direction as required during normal operation, as will be discussed and to enable members 58 to pivot about projection's 42 when members 22 are moved along recesses 38.

The heat staking of legs 52 in cooperation with body portions 50 being held by lips 48, and projections 42 aligning with openings 62, maintain securing members 22 within recesses 38 of chip carrier handler 20. Securing members 22 are now permanently mounted to chip carrier handler 20 and are slidably movable relative thereto as a result of the spring characteristics of members 22.

With the parts now in place the operation of chip carrier handler 20 and securing members 22 may be described. Securing members 22 are configured in such a way as to permit easy insertion and removal of chip carrier 2 from opening 18 of chip carrier handler 20. As shown from FIGS. 3 and 4, securing members 22 are mounted to chip carrier handler 20 in such a way as to permit securing members 22 to move relative to handler 20. To begin this movement, pressure is applied on body portions 50. This pressure is directed inward toward opening 18, as shown by the arrow in FIG. 2. As body portions 50 are moved inward, legs 52, 54, 56 are forced to move inward accordingly. However, due to the thin structure of the metal, the arcuate shape of outer legs 54, 56 and the fact that chip carrier engagement members 58 are pivotally mounted onto projections 42, the inward motion of outer legs 54, 56 is translated into an arcuate motion of members 58 allowing ends 66 of members 58 to pivot about projections 42.

Figure 2:
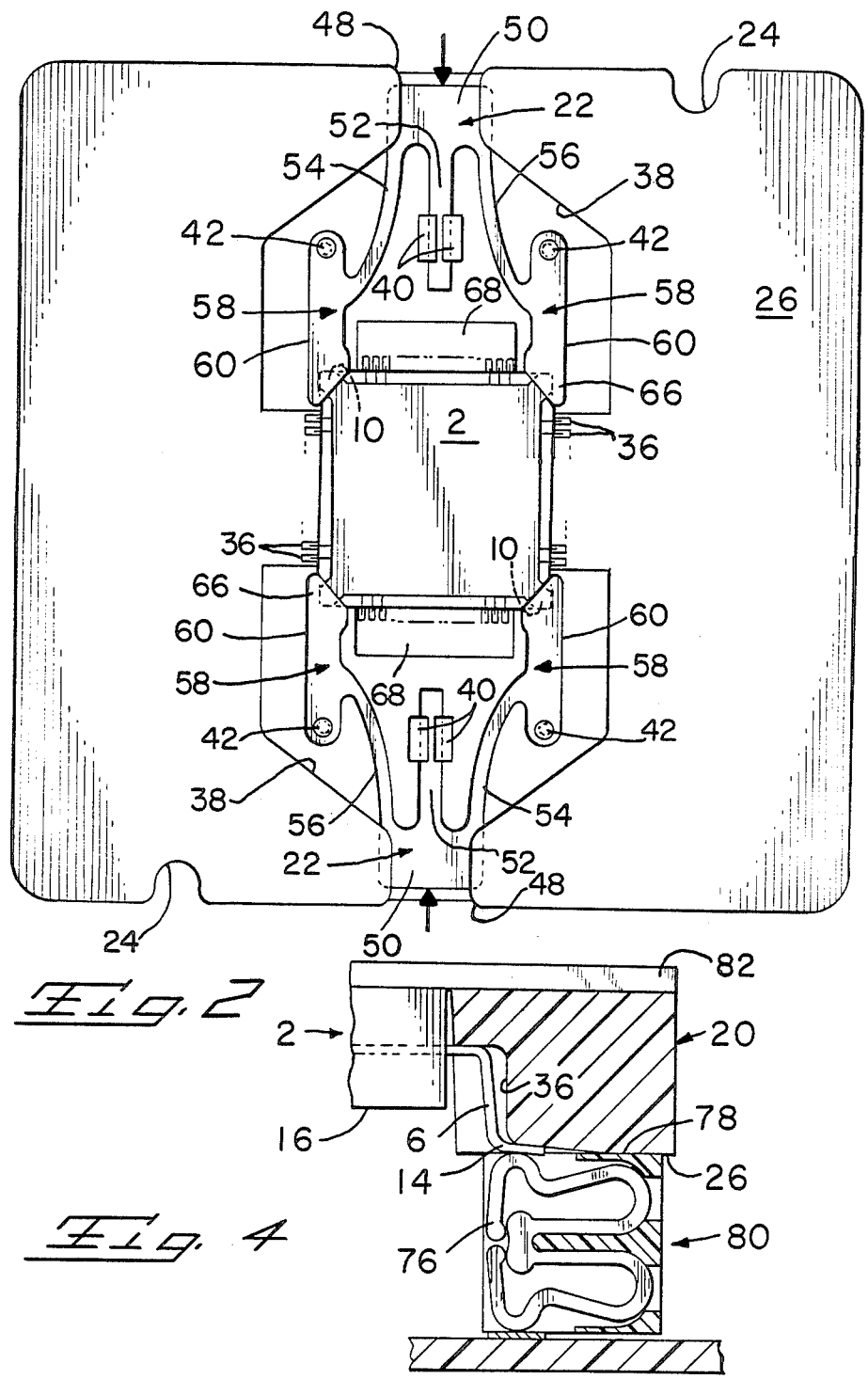
FIG. 2 is a fragmentary view showing the securing member in an unstressed or first position.
Figure 3:
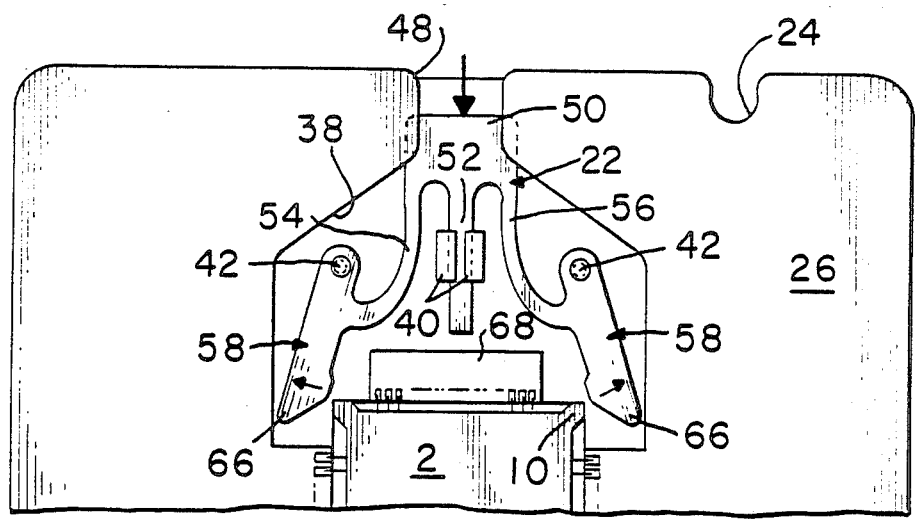
FIG. 3 is a fragmentary view similar to that of FIG. 2 showing the securing member in a stressed or second position.

The operation of securing members 22 is as follows. Securing members 22 are pushed inward either by a robotic device (not shown) or by some other means, causing legs 52, 54, 56 to move inward accordingly. As outside legs 54, 56 are integral parts of members 22 which in turn have members 58 pivotally mounted to projections 42, the inward motion of legs 54, 56 translates to an arcuate motion of ends 66 of members 58. Therefore, as body portions 50 are pushed inward, ends 66 are forced away from opening 18 allowing insertion of chip carrier 2 under zero insertion force conditions. Once chip carrier 2 is properly inserted, as discussed below, the inward force applied to body portions 50 is retracted, allowing the resilient characteristics of securing members 22 to return body portions 50 and legs 52, 54, 56 to the first position, as shown in FIG. 2. This causes members 22 to return to the unstressed position in which ends 66 are positioned above slots 30. This positioning allows ends 66 to extend across corners 10 of chip carrier 2 to maintain chip carrier 2 in opening 18 as shown in FIG. 2. The thickness of securing members 22 is such that securing members 22 must engage bottom surface 26 of chip carrier handler 20. In other words, securing members 22 have a thickness which is less than or equal to the portion of leads 6 which extends beyond bottom surface 16 of chip carrier 2.

As chip carrier 2 is placed into opening 18 of chip carrier handler 20, recesses 36 of opening 18 align with leads 6 of chip carrier 2 such that as chip carrier 2 is inserted into opening 18 leads 6 are positioned in respective recesses 36. It should be noted that recesses 36 are positioned on all sides of opening 18. To accommodate the positioning of leads 6 in recesses 38, projections 68 have been provided in recesses 38 to properly support leads 6 therein. Chip carrier 2 is properly positioned in opening 18 when the portion of leads 6 projecting from walls 12 of body 4 of chip carrier 2 engages ledge 32 of chip carrier handler 20. The positioning of ledge 32 is an important aspect of the invention. Ledge 32 cooperates with leads 6 instead of top surface 70 of chip carrier 2. This allows top surface 70 to be coplanar with second major surface 28 of chip carrier handler 20, enabling chip carrier handler 20 to be manufactured to occupy no more space in the Z direction than does chip carrier 2. This type of configuration not only keeps costs down by requiring less material for the manufacture of chip carrier handler 20 but it also minimizes shipping costs as less space is needed during transportation and less volume at the assembly machine.

As insertion of chip carrier 2 into chip carrier handler 20 occurs, corner projections 10 of chip carrier 2 align with corners 30 of chip carrier handler 20. As the dimensions of corners 30 and corner projections 10 are essentially the same and as chip carrier 2 is polarized, the insertion of corner projections 10 into corners 30 ensures that chip carrier 2 is properly positioned in opening 18 of chip carrier handler 20. The cooperation of slots 30 and corners 10 also prevents chip carrier 2 from rotating relative to chip carrier handler 20. Thus, corners 10 and slots 30 act as a positioning means, ensuring that leads 6 of chip carrier 2 will be accurately positioned with respect to the outside edges of chip carrier handler 20, thereby facilitating robotic handling of the chip carrier handler assembly. Robotic handling is facilitated because all that the robotic device has to do is position openings 72 of chip carrier handler 20 in alignment with posts 74 on the test site as shown in FIG. 1. As leads 6 are secured in place according to the positioning means, leads 6 are assured of being in alignment with interposer contacts 76 (of the type described in U.S. patent application Ser. No. 891,710 filed July 31, 1986) when the openings 72 of chip carrier handler 20 are properly positioned onto posts 74 at the test site by the robotic handler. In essence the robotic handler does not act as an accurate positioning means as this task is performed by the configuration of the parts. Consequently, a simplistic robotic handling device may be utilized in this process.

With chip carrier handler 20 now positioned on the test site, testing of the integrated circuit may begin. As testing occurs the quality of the integrated circuit contained in chip carrier 2 is determined. Accordingly, the test results must be marked on chip carrier 2 so that each integrated circuit is assigned to a job corresponding to its inherent operating characteristics. The configuration of chip carrier handler 20 is ideal for this type of situation. As top surface 70 of chip carrier 2 is essentially coplanar with second major surface 28 of chip carrier handler 20, the entire top surface 70 of chip carrier 2 is readily accessible, allowing coded numbers to be easily stamped on top surface 70 of chip carrier 2, thereby identifying the integrated circuit according to the results of the test.

Its to be noted that first major surface 26 of chip carrier handler 20 extends past bottom surface 16 of chip carrier 2, as shown in FIG. 4. Handler 20 extends to ends 14 of leads 6, thereby protecting leads 6 from damage during transportation and handling. Thus when testing is to occur contacts 76 of the interposer must protrude past the top surface 78 of the interposer housing 80 to make positive electrical contact with the leads 6 of chip carrier 2.

As chip carrier handler 20 is placed on the test site, contacts 76 of the interposer touch leads 6. To ensure a positive electrical contact between leads 6 and contacts 76 more force is required than can be obtained by merely setting handler 20 on top of interposer housing 80. A cover 82 is placed over the handler.

To release chip carrier 2 from chip carrier handler 20, both portions 50 of securing members 22 are again forced inward, causing the same motion of members 22 as previously described. Ends 66 are again moved from slots 30, allowing chip carrier 2 to be easily released from chip carrier handler 20. After chip carrier 2 is removed, securing members 22 are again returned to the first position, until such time as another chip carrier 2 is to be inserted in opening 18 of chip carrier handler 20.

Figure 6:
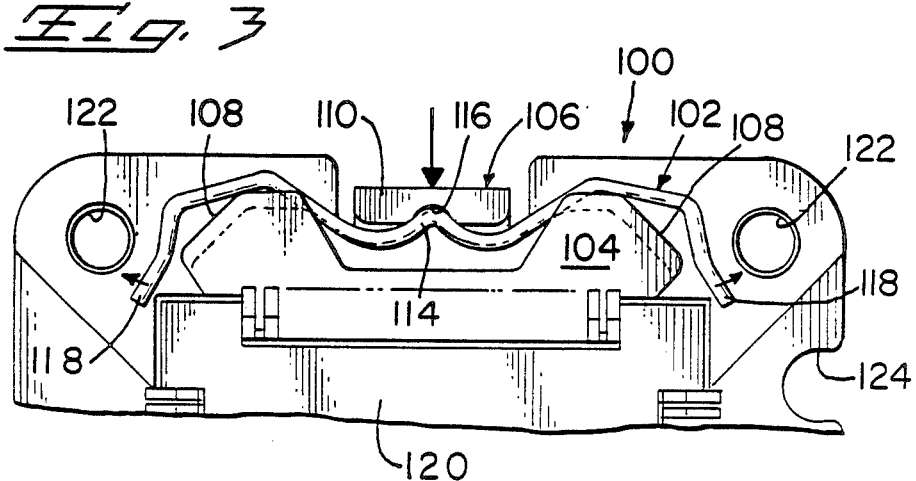
FIG. 6 is a view similar to that of FIG. 5 showing the wire securing member in the second position.
Figure 7:
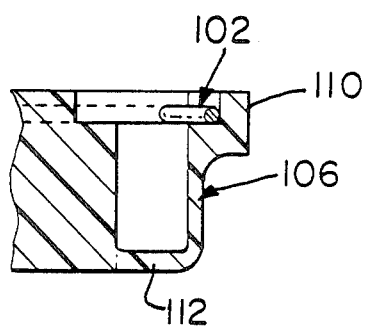
FIG. 7 is an enlarged cross-sectioned view taken along line 7—7 of FIG. 5 showing the configuration of the wire engagement arm.
Figure 5:
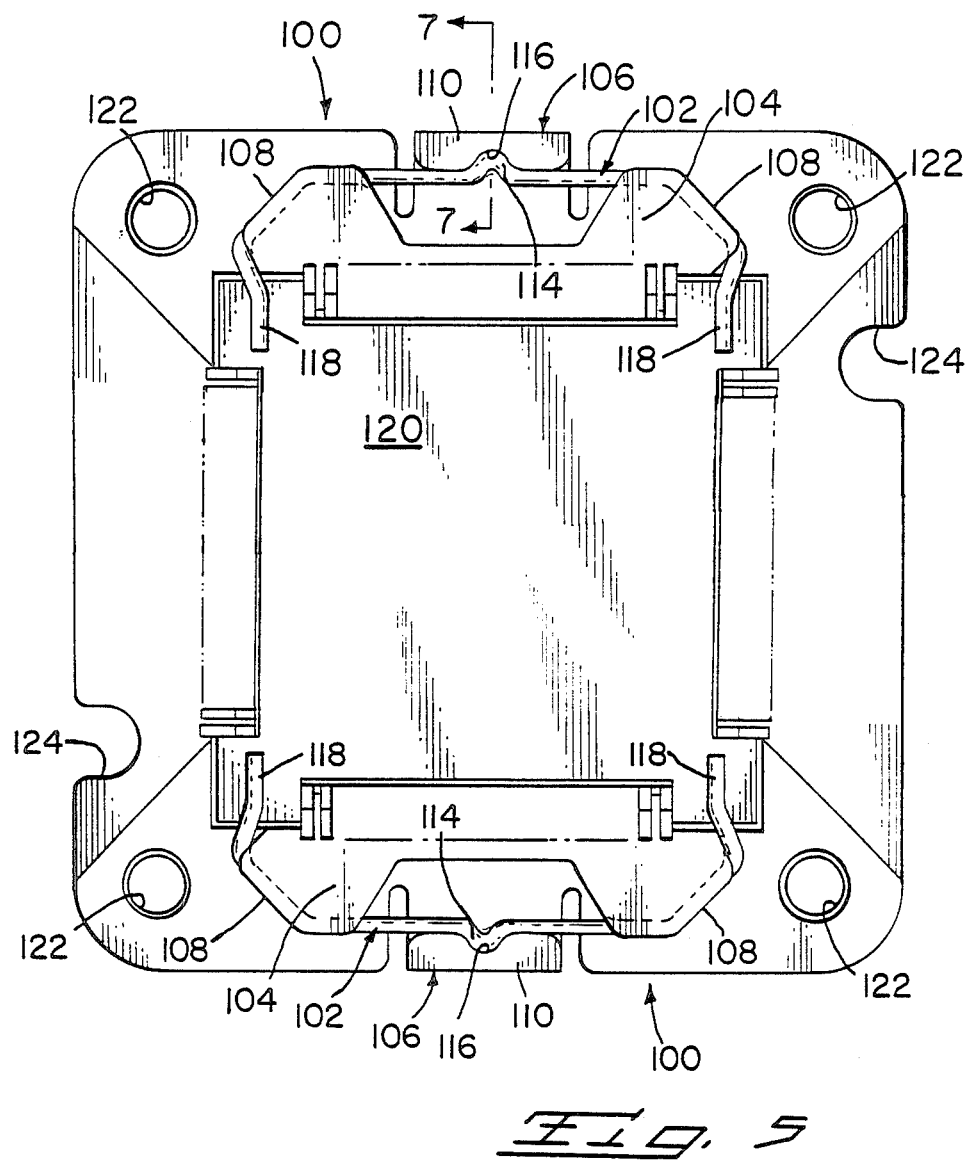
FIG. 5 is an alternative embodiment of a chip carrier handler showing a wire securing member in the first position.

FIGS. 5 through 7 show an alternative embodiment of the present invention. Securing members 102 are formed from thin wire which has the resilient characteristics required. Securing members 102 cooperate with projections 104 and wire engagement arms 106, as will be described.

Securing members 102 are maintained in position by lips 108 of projections 104. Lips 108 prevent members 102 from movement in the vertical direction, keeping members 102 in contact with protective handler 100.

The movement of securing member 102 is very similar to that previously described. Upper portions 110 of arms 106 are contacted and forced to pivot inward about pivot members 112 (FIG. 7). Formed embossments 114 of securing members 102 cooperate with arcuate surfaces 116 of arms 106 to maintain the proper positioning of members 102 as the movement occurs, i.e. embossment 114 and surfaces 116 cooperate to prevent members 102 from sliding to either side. The inward motion causes members 102 to move from the first position as shown in FIG. 5 to the second position as shown in FIG. 6. Thus, as the upper portions 110 force the midsection of members 102 to be moved inward, ends 118 of members 102 are forced from recess 120 allowing a chip carrier to be inserted and removed under zero insertion force conditions.

The remaining parts of handler 100 are essentially identical to the parts of handler 20. For example, the functions of openings 122 and recess 124 correspond to the functions of openings 72 and recesses 24, respectively.

Consequently, although the movement of the members may be different, the basic motions of the two embodiments described are similar. A force is applied to the securing member forcing the ends of the securing member to move from the recess allowing zero insertion force of the chip carrier.

Many unique features are present in this invention. First, the height of this chip carrier handler is identical to the height of the chip carrier, minimizing the material required to produce the chip carrier handler. Second, the configuration of the chip carrier handler has all fragile parts of chip carrier being protected with relatively smooth first and second major surfaces which enhances the stackability and workability of this chip carrier handler. Finally, the configuration of this handler makes robotic handling easy and cost effective. Therefore, the handler described herein is much more cost effective than its predecessors.

It should be noted that although robotic handling is frequently referred to in the description, this invention is just as useful if no robotic insertion is done. The configuration still reduces costs as less material is being used in the manufacturing process of the chip carrier and less space is required during transportation thereof.

I claim:

1. A chip carrier handler for use with a chip carrier having leads extending from a midsection of each side, the chip carrier handler comprising:

housing means having opposed first and second major surfaces;

an opening positioned in the center of the housing means, the opening extending through the housing from the first major surface to the second major surface, the opening dimensioned to receive the chip carrier;

the housing means having recesses adjacent the opening, the recesses extending from the first major surfce toward the second major surfce, the recesses dimensioned to receive the leads of the chip carrier;

securing means slidably mounted to the housing means, the securing means having chip carrier engagement means which are pivotally mounted to the housing means and which are positioned above the opening in the first position;

whereby as the chip carrier is inserted into the opening of the chip carrier handler, the securing means are slidably moved causing the engagement means to pivot, moving the engagement means away from the opening to a second position, such that the chip carrier can be inserted into the opening under reduced insertion force conditions, the chip carrier being fully inserted when the chip carrier and the housing means cooperate to define a stop position, thereby allowing the securing means to resiliently return to the unstressed position, causing the engagement means to return to the first position, thereby maintaining the chip carrier in place in the opening.

2. A chip carrier handler as described in claim 1 wherein the opening is provided with corners, the corners align with corner projections of the chip carrier such that when the chip carrier is inserted into the opening, the corners and corner projections cooperate to act as a positioning means, accurately positioning the leads of the chip carrier relative to edges of the chip carrier handler.

3. A chip carrier handler as described in claim 1 wherein the securing means are located in recess means, the recess mean are positioned on the first major surface of chip carrier handler.

4. A chip carrier handler as described in claim 3 wherein each recess means extends from an edge of the chip carrier handler to the opening, the recess means having a narrow portion adjacent the edge.

5. A chip carrier handler as described in claim 4 wherein the narrow portion has projections extending inward from side walls of the narrow portion.

6. A chip carrier handler as described in claim 5 wherein the recess means has projections extending therefrom.

7. A chip carrier handler as described in claim 6 wherein the securing means is comprised of a body portion, a middle arm, and two outside arcuately-shaped arms having the chip carrier engagement means located at the ends thereof.

8. A chip carrier handler as described in claim 7 wherein the body portion of the securing means cooperates with the projections of the narrow portion, the middle arm cooperates with first projections of the recess means and the chip carrier engagement means cooperates with second projections of the recess means to secure the securing means to the chip carrier handler in such a manner as to permit the body portion to be forced inward causing the chip carrier engagement means to pivot between the first and the second position.

9. A chip carrier handler as described in claim 1 wherein the chip carrier handler is essentially the same height as the chip carrier.

10. A chip carrier handler as described in claim 1 wherein outer recess means are provided around edges of the chip carrier handler, the outer recess means are provided to facilitate the use of a robotic handler.

11. A chip carrier handler as described in claim 1 wherein a cover means cooperates with the chip carrier handler to ensure that proper contact force is provided between the leads of the chip carrier and the contacts of an interposer at a testing site.

12. A chip carrier handler as described in claim 1 wherein the securing means is formed from wire material, the securing means cooperate with pivot means such that as the pivot means is engaged, the securing means is contacted causing the chip carrier engagement means to pivot allowing insertion of the chip carrier under reduced insertion force conditions.

13. A chip carrier handler for use with a chip carrier having electrical leads extending from each side thereof, comprising:

housing means having an opening extending from an upper surface to a bottom surface thereof for receiving the chip carrier therein, said housing means having recesses adjacent said opening in which the electrical leads are disposed;

securing means slidably mounted onto said housing means and having engaging means pivotally mounted onto said housing means between a first position out of engagement with the chip carrier and a second position maintaining the chip carrier in said opening, resilient arm means as part of said securing means connected to said engaging means so that upon a force being applied to said securing means, said resilient arm means move said engaging means to the first position and upon removal of the force, said resilient arms move the engaging means to the second position; and means provided by said housing means and said securing means mounting said securing means onto said housing means.

14. A chip carrier handler as described in claim 13 wherein the opening is provided with corners, the corners align with corner projections of the chip carrier such that when the chip carrier is inserted into the opening the corners and corner projections cooperate to act as a positioning means, accurately positioning the leads of the chip carrier relative to edges of the chip carrier handler.

15. A chip carrier handler as described in claim 13 wherein the securing means are located in recess means, the recess means are positioned on the first major surface of chip carrier handler, wherein each recess means extends from an edge of the chip carrier handler to the opening, the recess means having a narrow portion adjacent the edge.

16. A chip carrier handler as described in claim 15 wherein the narrow portion has projections extending inward from side walls of the narrow portion.

17. A chip carrier handler as described in claim 16 wherein the recess means has projections extending inward from a bottom surface of the recess means toward the first major surface of the chip carrier handler.

18. A chip carrier handler as described in claim 17 wherein the securing means is comprised of a body portion, a middle arm, and two outside arcuately-shaped arms having the chip carrier engagement means located at the ends thereof, wherein the body portion of the securing means cooperates with the projections of the narrow portion, the middle arm cooperates with first projections of the recess means and the chip carrier engagement means cooperates with second projections of the recess means to secure the securing means to the chip carrier handler in such a manner as to permit the body portion to be forced inward causing the chip carrier engagement means to pivot between the first and the second position.

19. A chip carrier handler as described in claim 13 wherein outer recess means are provided around edges of the chip carrier handler, the outer recess means are provided to facilitate the use of a robotic handler.

20. A chip carrier handler as described in claim 13 wherein the securing means is formed from wire material, the securing means cooperate with pivot means such that as the pivot means is engaged the securing means is contacted causing the chip carrier engagement means to pivot allowing insertion of the chip carrier under reduced insertion force conditions.

* * * * *